April 29, 1969 M. S. SHAIKH 3,441,454

METHOD OF FABRICATING A SEMICONDUCTOR BY DIFFUSION

Filed Oct. 29, 1965

INVENTOR

Mohammed S. Shaikh

BY

C. L. Menzemer

ATTORNEY

United States Patent Office 3,441,454

Patented Apr. 29, 1969

3,441,454

METHOD OF FABRICATING A SEMICONDUCTOR BY DIFFUSION

Mohammed S. Shaikh, Garland, Tex., assignor to Westinghouse Electric Corporation, Pittsburgh, Pa., a corporation of Pennsylvania Filed Oct. 29, 1965, Ser. No. 505,688
Int. Cl. H01l 7/66, 7/34
U.S. Cl. 148—188 2 Claims This invention relates to the production of semiconductor devices having a P-N junction formed therein, and more particularly to a process for the continuous production of semiconductor devices from silicon dendrite webs.

Figures 1, 2:
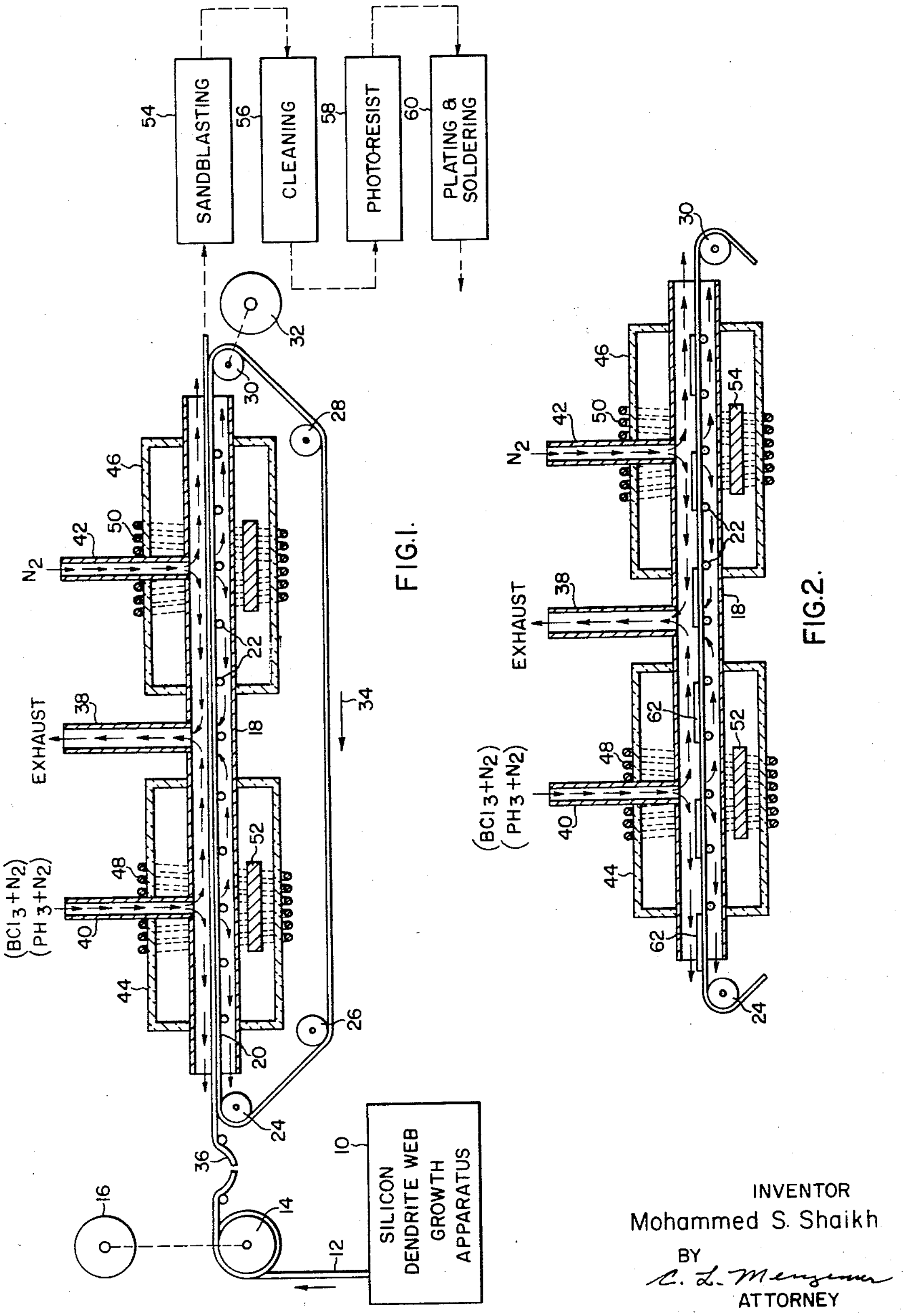

In the conventional production of semiconductor devices having a P-N junction therein, a wafer of semiconductor material of one conductivity type is placed in an open-tube diffusion furnace and subjected to a gaseous diffusant, usually in the presence of an inert carrier gas. For example, if it is desired to diffuse boron into silicon, a wafer of N-type silicon is placed within an open-tube diffusion furnace and heated to approximately 1100° C. while boron trichloride and nitrogen flow through the tube. The boron trichloride reacts with the silicon, displaces silicon atoms, and deposits elemental boron on the surface of the wafer. When a layer of boron has been deposited on the surface, the flow of boron trichloride is cut off and the boron so deposited is allowed to diffuse into the silicon in a nitrogen atmosphere at the furnace temperature in order to form a P-N junction. In this process, both the flow of boron trichloride and nitrogen and the furnace temperature have to be monitored. Flow rates, temperature and diffusion time are all very critical.

As one object, the present invention provides a method for diffusing a dopant element into a semiconductor body on a continuous production line basis, which process does not require monitoring of flow rates, temperature and diffusion time.

Another object of the invention is to provide a simple and elementary process which will yield continuous and automatic fabrication of semiconductor bodies having P-N junctions therein.

Another object of the invention is to provide a process which will yield continuous and automatic fabrication of semiconductor solar cells from a silicon dendrite puller to the completed device.

Still another object of the invention is to provide a new and improved open-tube diffusion furnace having two zones through which a semiconductor body passes, a dopant element being deposited on the surface of the semiconductor body in one of said zones and diffusion of the dopant element into the semiconductor body occurring in the other of the zones in an inert atmosphere.

While not limited thereto, the invention is particularly adapted for use in the manufacture of semiconductor solar cells wherein a shallow P-N junction is formed about one-half micron beneath the surface of a semiconductor wafer. Furthermore, as will become apparent from the following detailed description, the invention finds special utility with silicon dendrite webs of the type described in U.S. Patent No. 3,129,061 issued Apr. 14, 1964, and assigned to the assignee of the present application. Such silicon dendrite webs comprise an elongated unitary body of semiconductor material having a central portion and two edge portions, the central portion being comprised of a thin, flat sheet of substantially dislocation free, single crystal, semiconductor material crystallographically joined to the edge portions. Each of the edge portions comprises a dendritic crystal of the semiconductor material, and the central portion has a highly uniform thickness over the length of the body. Such silicon dendrite webs can be grown at a rate of about 1 to 4 inches per minute and, in accordance with the present invention, may be passed continuously through an open-tube diffusion furnace wherein a layer of the silicon dendrite web of one conductivity type is converted to the other conductivity type to form a P-N junction. After passing through the furnace, the web is then cut into pieces of desired length for further processing.

The above and other objects and features of the invention will become apparent from the following detailed description taken in connection with the accompanying drawings which form a part of this specification, and in which:

FIGURE 1 is a schematic illustration of one embodiment of the invention wherein a continuous silicon dendrite web is passed through a diffusion furnace; and FIG. 2 is a schematic illustration of another embodiment of the invention wherein separated silicon wafers are passed through the diffusion furnace.

With reference now to the drawings, and particularly to FIG. 1, the numeral 10 designates silicon dendrite web growth apparatus of the type shown and described in the aforesaid U.S. Patent No. 3,129,061, assigned to the assignee of the present application. By reference to that patent, it will be seen that the dendritic growth apparatus includes a melt of silicon which is initially contacted with a seed crystal of silicon for a sufficient period of time to wet the seed. The seed crystal has at least two parallel twin planes which come into contact with a supercooled area of the melt, and when the seed crystal is pulled upwardly at least two parallel dendrites will form which are joined by a thin flat web. The resulting structure is an elongated sheet-like body of silicon crystallizing in the diamond cubic lattice structure and having at least two parallel elongated dendritic crystals spaced apart by a thin web portion extending between the dendritic crystals over the entire length of the body.

The resulting dendritic web may be withdrawn from the melt at a rate of about 1 to 4 inches per minute and is characterized in that it is relatively flexible and may be bent on a circle of a radius of about 4 feet or even less without breaking. In starting the crystal from a seed, the seed is attached to a lead which is withdrawn, thereby forming the continuous dendritic web 12 shown in FIG. 1. This web is wound around a drum 14 through at least one complete 360° arc such that as the drum 14 is driven by means of motor 16, for example, the web 12 will be withdrawn from the growth apparatus 10 at the desired rate (i.e., about 1 to 4 inches per minute).

After passing around the drum 14, the web 12 passes through the diffusion furnace of the invention which, as shown in FIG. 1, comprises an elongated tube 18 which is open at both ends. Extending throughout the length of the tube 18 is a continuous conveyor belt 20 supported, for example, on rollers 22. Exteriorly of the tube 18, the conveyor belt 20 passes around rolls 24, 26, 28 and 30, the roll 30 being driven by means of motor 32 in order to impart to the lower reach of the belt 20 the direction of movement indicated by arrow 34. The upper reach of the belt 20 which passes through the open-ended tube 18 will, of course, move in the opposite direction, or from left to right as viewed in FIG. 1.

After passing around the drum 14, the continuous dendritic web 12 is looped as at 36 in order to compensate for any differences in speed between the drum 14 and belt 20. Thereafter, it passes onto the upper reach of belt 20 and consequently, is conveyed through the tube 18 from left to right as a continuous length.

As shown, the tube 18 is provided with a central exhaust vent 38 and two inlet ports 40 and 42 on either side of the exhaust vent 38 and spaced therefrom. Surrounding the tube 18 on either side of the exhaust vent 38 are two furnace enclosures 44 and 46, the inlet port 40 projecting through enclosure 44 and inlet port 42 projecting through enclosure 46. Both of the enclosures 44 and 46 are formed from insulating material and are surrounded by induction coils 48 and 50, respectively, which serve to generate eddy currents within iron cores 52 and 54 within the enclosures 44 and 46. As will be understood, the eddy currents thus generated within the cores 52 and 54 generate heat which, in turn, heats the continuous web 12 as it passes through the furnace enclosures 44 and 46.

Assuming that the continuous web 12 is of N-type silicon and that it is desired to diffuse a P-type region therein, a mixture of gases comprising boron trichloride and nitrogin will be introduced into the tube 18 through inlet port 40. Nitrogen alone, on the other hand, will be introduced into the inlet port 42; and while nitrogen is the most economical and satisfactory gas for this application, any inert gas such as argon or helium may be used in its place. The main requirement of the inert gas is that it act as a carrier for the boron trichloride and that it prevent oxidation of the silicon during diffusion.

In operation, the continuous silicon dendrite web 12 enters the left end of the tube 18 and moves slowly through the furnace enclosure 44 at a constant speed determined by the speed of motor 32. Each incremental length of the web 12 takes the same interval of time in passing through the enclosure 44 with the result that the boron trichloride reacts uniformly on the surface of the web, yielding a uniform deposit of boron throughout the length of the web. The mixture of boron trichloride and nitrogen escapes through the open left end of the tube 18 and the vent 38 while the web 12 continues its journey through the tube 18 and enters the zone of furnace enclosure 46. As the web passes through furnace enclosure 46, a large flow of nitrogen is introduced through port 42 and maintained. Consequently, the boron deposited as the web passed through enclosure 44 is allowed to diffuse during passage of the web through enclosure 46. The width of the high temperature zone determined by the length of enclosure 46 is so adjusted that the duration of travel through the high temperature zone equals the intended diffusion. Furthermore, the length of the tube 18 is such that by the time the samples emerge from its right end, their temperature will have dropped below 600° C. In the case of silicon solar cells, for example, the length of the high temperature zone determined by the length of enclosure 46 will be such as to diffuse boron into the N-type silicon web to a depth of about one-half micron. As will be appreciated, the particular dimensions shown in the drawings are for purposes of illustration only and will be varied to suit requirements depending upon the type of diffusion desired.

In the foregoing example, it was assumed that an N-type silicon web 12 passed through the tube 18. If, however, a P-type web 12 is the starting material, it is then necessary to diffuse an N-type dopant. This, for example, may be facilitated by introducing a mixture of phosphine ($PH_3$) and nitrogen into the inlet port 40, whereupon elemental phosphorus will be deposited on the web as it passes through the furnace enclosure 44, and thereafter diffused into the silicon web as it passes through enclosure 46. In either case, the length of the enclosure 44 must be such as to permit deposition of phosphorus, boron or some other suitable dopant element (either N-type or P-type) and the length of enclosure 46 must be sufficient to permit diffusion of the dopant element to the desired depth.

At the right end of tube 18, the web 12, after diffusion, is cut to lengths. The edge dendritic portions may be left on the lengths or they may be removed by sandblasting, electron beam cutting, chemical etchings scribing or the like, and the resulting device fabricated entirely upon the single crystal web or sheet portion formed by the silicon dendritic web growth apparatus 10.

As will be understood, both the top, bottom and edges of the web 12 will be diffused in passing through tube 18. In order to remove all but a single diffused layer on one side of the cut samples, they are mounted on plates soaked in wax such that one side of the samples can be sandblasted. In the preferred embodiment of the invention, a carrier belt, not shown, moves the wax-mounted samples through a sandblasting chamber, schematically illustrated at 54 in FIG. 1. While passing through this chamber, the diffused layer from one side is removed. The samples then pass through an automatic hood assembly, schematically illustrated at 56. The automatic hood assembly 56 consists of a number of trays containing solvents and acids, a deionized water channel, and a sample holder arm. The samples are removed from the waxed plates after sandblasting and are placed in a basket attached to the sample holder arm. The samples in the basket are then dipped successively in solvents, water, boiling acids and the like to effect cleaning. Thus, the samples emerge out of the automatic hood assembly 56 with clean surfaces suitable for contacting.

The samples are then carried to a photo-resist chamber 58. Here, the samples are coated with a photo-resist compound on the diffused side, exposed through a photographic plate on which the desired grid pattern is printed, and developed. The operations of washing in different trays to effect conversion of the photo-resist compound into a polymer and removal of the unexposed portions takes place in different trays similar to the cleaning operation. After developing and washing, the samples are baked under infrared lamps, and are then carried to an automatic plating and soldering station 60 where the samples are first treated in hydrofluoric acid, washed in deionized water and nickel-plated in an electroless plating bath as an alternative to plating. A suitable metal may be evaporated and sintered in place on the wafers. After nickel-plating or evaporation procedure, the samples are again washed in hot trichloroethylene or another suitable solvent to remove the photo-resist. Finally, the samples are washed, dipped in flux and their undiffused surfaces soldered by dipping into a melted solder bath in accordance with conventional practice.

In FIG. 2, the diffusion furnace shown is the same as that of FIG. 1. Accordingly, like elements are identified by like reference numerals. However, instead of passing a continuous silicon dendrite web through the tube 18, individual, separated silicon single crystal wafers 62, either P-type or N-type as the case may be, are passed through the tube 18 on conveyor 20. The diffusion process within tube 18 is, of course, the same; however the use of wafers cut from a single crystal requires that they be lapped and electropolished prior to diffusion as in the conventional process.

Although the invention has been shown in connection with certain specific examples, it will be readily apparent to those skilled in the art that various changes may be made to suit requirements without departing from the spirit and scope of the invention. In this respect, it will be appreciated that P or N-type dopant elements may be employed in the invention other than boron or phosphorus, as long as the element can form a compound capable of existing in the vapor state.

I claim as my invention:

1. In the process for producing semiconductor bodies of one conductivity type having diffused therein a region of the opposite conductivity type, the steps of (1) continuously withdrawing a ribbon of semiconductor material from a melt, (2) passing the continuous ribbon through an elongated tube, (3) depositing a dopant element on the surface of the ribbon as it passes through the tube, thereafter (4) heating the ribbon within the tube in the presence of an inert gas for a sufficient time to permit the dopant element to diffuse into the ribbon, and finally (5) cutting the ribbon into separated lengths after it has emerged from said tube.

2. In the process for producing semiconductor bodies of one conductivity type having diffused therein a region of the opposite conductivity type, the steps of (1) continuously withdrawing a ribbon of semiconductor material from a melt, (2) passing the continuous ribbon through an elongated tube, (3) heating the ribbon as it passes through the tubes, (4) subjecting the ribbon to a vaporized compound incorporating a dopant element of said other conductivity type whereby the compound will react with the ribbon of semiconductor material as it passes through the tube and deposit the dopant element on its surface, thereafter (5) heating the ribbon within the tube in the presence of an inert gas for a sufficient time to permit the dopant element to diffuse into the ribbon, and finally (6) cutting the ribbon into separated lengths after it has emerged from said tube.

References Cited

UNITED STATES PATENTS

| | | | |
|---|---|---|---|
| 3,104,991 | 9/1963 | MacDonald | 148—188 XR |
| 3,133,840 | 5/1964 | Gibson | 148—189 |
| 3,223,554 | 12/1965 | Newman | 117—107.1 XR |
| 3,287,187 | 11/1966 | Rosenheinrich | 148—188 XR |

HYLAND BIZOT, *Primary Examiner.*

U.S. Cl. X.R.

148—186